United States Patent
Irby et al.

(10) Patent No.: US 10,521,338 B2
(45) Date of Patent: Dec. 31, 2019

(54) METHOD, SYSTEM AND DEVICE FOR MEMORY DEVICE OPERATION

(71) Applicant: ARM Ltd., Cambridge (GB)

(72) Inventors: Joel Thornton Irby, Austin, TX (US); Mudit Bhargava, Austin, TX (US); Alan Jeremy Becker, Bushey (GB)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/614,130

(22) Filed: Jun. 5, 2017

(65) Prior Publication Data

US 2018/0349264 A1  Dec. 6, 2018

(51) Int. Cl.
| | |
|---|---|
| *G06F 12/02* | (2006.01) |
| *G06F 12/06* | (2006.01) |
| *G06F 9/30* | (2018.01) |
| *G11C 16/10* | (2006.01) |
| *G06F 13/16* | (2006.01) |

(Continued)

(52) U.S. Cl.
CPC ...... *G06F 12/0238* (2013.01); *G06F 9/30018* (2013.01); *G06F 12/0676* (2013.01); *G06F 13/1668* (2013.01); *G11C 7/1009* (2013.01); *G11C 13/0002* (2013.01); *G11C 13/0038* (2013.01); *G11C 13/0061* (2013.01); *G11C 13/0069* (2013.01); *G11C 16/107* (2013.01); *G11C 7/20* (2013.01); *G11C 2207/2227* (2013.01)

(58) Field of Classification Search
CPC ....... G11C 16/107; G11C 7/1009; G11C 7/20; G11C 13/0002; G11C 13/0038; G11C 13/0061; G11C 13/0069; G11C 13/107; G11C 2207/2227; G06F 12/0238; G06F 12/0676; G06F 9/30018; G06F 13/1668

USPC ........................................................ 365/148
See application file for complete search history.

(56) References Cited

U.S. PATENT DOCUMENTS 4,467,444 A * 8/1984 Harmon, Jr. ............ G06F 7/575
708/490
7,298,640 B2   11/2007 Chen et al.
(Continued)

FOREIGN PATENT DOCUMENTS

| WO | 2016053553 A1 | 4/2016 |
| WO | 2017085498 A1 | 5/2017 |

OTHER PUBLICATIONS

Notification of Transmittal of the International Search Report and the Written Opinion of the International Searching Authority, or the Declaration, App. No. PCT/GB2018/051520, Filed Jun. 4, 2018, dated Sep. 3, 2018, 1 Page.

(Continued)

*Primary Examiner* — Sung Il Cho
(74) *Attorney, Agent, or Firm* — Berkeley Law & Technology Group, LLP

(57) ABSTRACT

Disclosed are methods, systems and devices for operation of memory device. In one aspect, bit positions of a portion of a memory array may be placed in a first value state. Values to be written to the bit positions may be determined subsequent to placement of the bit positions in the first value state. Values at selected ones of the bit positions may then be changed from the first value state to a second value state while maintaining remaining unselected ones of the bit positions in the first value state so that the bit positions store or represent the values determined to be written to the bit positions.

18 Claims, 8 Drawing Sheets

(51) Int. Cl.
  *G11C 7/10* (2006.01)
  *G11C 13/00* (2006.01)
  *G11C 7/20* (2006.01)

(56) References Cited

U.S. PATENT DOCUMENTS

| | | | |
|---|---|---|---|
| 7,639,523 | B2 | 12/2009 | Celinska et al. |
| 7,778,063 | B2 | 8/2010 | Brubaker et al. |
| 7,872,900 | B2 | 1/2011 | Paz de Araujo et al. |
| 9,514,814 | B1 | 12/2016 | Sandhu et al. |
| 9,558,819 | B1 | 1/2017 | Aitken et al. |
| 9,584,118 | B1 | 2/2017 | Dao et al. |
| 9,589,634 | B1* | 3/2017 | Jeyasingh ........... G11C 13/0033 |
| 9,589,636 | B1 | 3/2017 | Bhavnagarwala et al. |
| 2002/0116602 | A1* | 8/2002 | Kissell ................ G06F 9/30018 |
| | | | 712/223 |
| 2002/0174324 | A1* | 11/2002 | Busaba .................. G06F 7/764 |
| | | | 712/221 |
| 2004/0105301 | A1* | 6/2004 | Toyoda .............. G11C 13/0004 |
| | | | 365/154 |
| 2005/0045919 | A1 | 3/2005 | Kaeriyama et al. |
| 2008/0106925 | A1* | 5/2008 | Paz de Araujo ........ H01L 45/04 |
| | | | 365/148 |
| 2008/0106926 | A1* | 5/2008 | Brubaker ............ H01L 27/2409 |
| | | | 365/148 |
| 2008/0106927 | A1* | 5/2008 | Celinska ................ H01L 45/04 |
| | | | 365/148 |
| 2008/0107801 | A1* | 5/2008 | Celinska ................ H01L 45/04 |
| | | | 427/96.7 |
| 2010/0080071 | A1 | 4/2010 | Huang et al. |
| 2010/0125858 | A1 | 5/2010 | Fry et al. |
| 2013/0200323 | A1 | 8/2013 | Pham et al. |
| 2013/0214232 | A1 | 8/2013 | Tendulkar et al. |
| 2013/0285699 | A1* | 10/2013 | McWilliams ........ H03K 19/173 |
| | | | 326/41 |
| 2015/0043275 | A1* | 2/2015 | Srinivasan ......... G11C 16/3459 |
| | | | 365/185.03 |
| 2016/0163978 | A1* | 6/2016 | Paz de Araujo .... H01L 45/1608 |
| | | | 257/4 |
| 2017/0033782 | A1 | 2/2017 | Shifren et al. |
| 2017/0045905 | A1 | 2/2017 | Sandhu et al. |
| 2017/0047116 | A1 | 2/2017 | Sandhu et al. |
| 2017/0047919 | A1 | 2/2017 | Sandhu et al. |
| 2017/0069378 | A1 | 3/2017 | Shifren et al. |
| 2018/0190353 | A1* | 7/2018 | Srinivasan ......... G11C 13/0033 |

OTHER PUBLICATIONS

International Search Report, App. No. PCT/GB2018/051520, Filed Jun. 4, 2018, dated Sep. 3, 2018, 5 Pages.
Written Opinion of the International Searching Authority, App. No. PCT/GB2018/051520, Filed Jun. 4, 2018, dated Sep. 3, 2018, 9 Pages.

* cited by examiner

| Word Status | Contents |
|---|---|
| 1 | fallow |
| 1 | fallow |
| 1 | fallow |
| 1 | fallow |
| 1 | fallow |
| 1 | fallow |
| 1 | fallow |

*FIG. 5A*

| Word Status | Contents |
|---|---|
| 0 | $w_0$ |
| 0 | $w_1$ |
| 0 | $w_2$ (dirty) |
| 0 | $w_3$ |
| 0 | $w_4$ |
| 1 | fallow |
| 1 | fallow |

*FIG. 5B*

| Word Status | Contents |
|---|---|
| 0 | $w_0$ |
| 0 | $w_1$ |
| 1 | fallow |
| 0 | $w_3$ |
| 0 | $w_4$ |
| 1 | fallow |
| 1 | fallow |

*FIG. 5C*

METHOD, SYSTEM AND DEVICE FOR MEMORY DEVICE OPERATION

BACKGROUND

1. Field

Disclosed are techniques for utilizing memory devices.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

One type of non-volatile memory, electrically erasable programmable read-only memory (EEPROM) devices have large cell areas and may require a large voltage (e.g., from 12.0 to 21.0 volts) on a transistor gate to write or erase. Also, an erase or write time is typically of the order of tens of microseconds. One limiting factor with EEPROMs is the limited number of erase/write cycles to no more than slightly over 600,000—or of the order of $10^5$-$10^6$. The semiconductor industry has eliminated a need of a pass-gate switch transistor between EEPROMs and non-volatile transistors by sectorizing a memory array in such a way that "pages" (e.g., sub-arrays) may be erased at a time in EEPROMs called flash memory devices. In flash memory devices, an ability to keep random access (erase/write single bits) was sacrificed for speed and higher bit density.

More recently, FeRAMs (Ferroelectric RAMs) have provided low power, relatively high write/read speed, and endurance for read/write cycles exceeding 10 billion times. Similarly, magnetic memories (MRAMs) have provided high write/read speed and endurance, but with a high cost premium and higher power consumption. Neither of these technologies reaches the density of flash memory devices, for example. As such, flash remains a non-volatile memory of choice. Nevertheless, it is generally recognized that flash memory technology may not scale easily below 65 nanometers (nm); thus, new non-volatile memory devices capable of being scaled to smaller sizes are actively being sought.

Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. Typical materials vary and may include GeSbTe, where Sb and Te can be exchanged with other elements of the same or similar properties on the Periodic Table. However, these resistance-based memories have not proved to be commercially useful because their transition between the conductive and the insulating state depends on a physical structure phenomenon (e.g., melting at up to 600 degrees C.) and returning to a solid state that cannot be sufficiently controlled for a useful memory in many applications.

Another variable resistance memory category includes materials that respond to an initial high "forming" voltage and current to activate a variable resistance function. These materials may include, for example, $Pr_xCa_yMn_zO_\varepsilon$, with x, y, z and ε of varying stoichiometry; transition metal oxides, such as CuO, CoO, $VO_N$, NiO, $TiO_2$, $Ta_2O_5$; and some perovskites, such as Cr; $SrTiO_3$. Several of these memory types exist and fall into the resistive RAMs (ReRAMs) or conductive bridge RAMS (CBRAM) classification, to distinguish them from the chalcogenide type memories. It is postulated that resistance switching in these RAMs is due, at least in part, to the formation of narrow conducting paths or filaments connecting the top and bottom conductive terminals by the electroforming process, though the presence of such conducting filaments is still a matter of controversy. Since operation of a ReRAM/CBRAM may be strongly temperature dependent, a resistive switching mechanism in a ReRAM/CBRAM may also be highly temperature dependent. Additionally, these systems may operate stochastically as the formation and movement of the filament is stochastic. Other types of ReRAM/CBRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

SUMMARY

Briefly, particular implementations are directed a method comprising: placing bit positions of a portion of a memory array in a first value state; determining values to be written to the bit positions subsequent to placement of the bit positions in the first value state; and changing values states of selected ones of the bit positions from the first value state to a second value state while maintaining remaining unselected ones of the bit positions in the first value state so that the bit positions store or represent the values determined to be written to the bit positions.

Another particular implementation is directed to a device comprising: a memory array; and a memory controller configured to initiate operations to at least write value states to addressable portions of the memory to: place bit positions of a portion of the memory array in a first value state; determine values to be written to the bit positions subsequent to placement of the bit positions in the first value state; and changing value states of selected ones of the bit positions from the first value state to a second value state while maintaining remaining unselected ones of the bit positions in the first value state so that the bit positions store or represent the values determined to be written to the bit positions.

It should be understood that the aforementioned implementations are merely example implementations, and that claimed subject matter is not necessarily limited to any particular aspect of these example implementations.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages

FIGS. 5A through 5C illustrate changes in contents of portions of a memory array according to an embodiment;

Figure 1A:
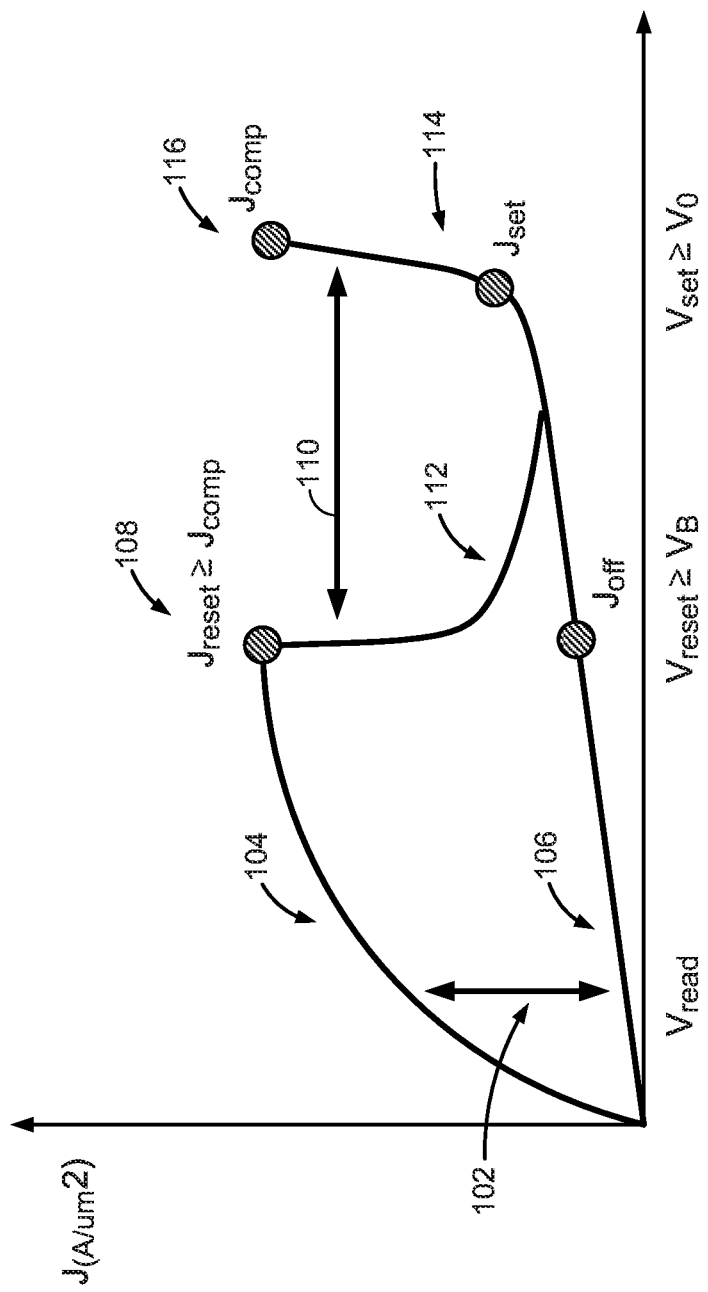
FIG. 1A shows a plot of current density versus voltage for a CES device according to an embodiment.

Reference is made in the following detailed description to accompanying drawings, which form a part hereof, wherein like numerals may designate like parts throughout that are identical, similar and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

Particular aspects of the present disclosure incorporate a Correlated Electron Material (CEM) to form a correlated electron switch (CES) element. In this context, a CES element may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES element may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES element between an insulative state and a conductive state may be understood in terms of a Mott transition. In a Mott transition, a material may switch from an insulative state to conductive state if a Mott transition condition occurs. The criteria may be defined by the condition $(n_C)^{1/3} a = 0.26$, where $n_C$ is a concentration of electrons and "a" is a Bohr radius. If a critical carrier concentration is achieved such that the Mott criteria is met, a Mott transition may occur and state may change from a high resistance/capacitance to a low resistance/capacitance.

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In particular implementations of aspects of this disclosure, a resistive switching integrated circuit memory may comprise: a resistive switching memory cell including a CES element; a write circuit for placing the resistive switching memory cell in a first resistive state or a second resistive state depending on signals provided to the memory cell, wherein the impedance of the CES element is higher in the second impedance state than in the first impedance state; and a read circuit for sensing the state of the memory cell and providing an electrical signal corresponding to the sensed state of the memory cell. In a particular implementation, a CES element may switch resistive states responsive to a Mott-transition in the majority of the volume of the CES element. In one aspect, a CES element may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In a particular embodiment, a CES element may be formed as a "CEM random access memory (CeRAM)" device. In this context, a CeRAM device comprises a material that may transition between or among a plurality of predetermined detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative memory states. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first memory state referred to as an insulative or high impedance memory state the memory device in one aspect is less conductive (or more insulative) than while the memory device in a second memory state referred to as a conductive or low impedance memory state. Furthermore, as discussed below with respect to a particular implementation, a CES element may be placed in any one of two or more different and distinguishable low impedance or conductive states.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1A shows a plot of current density versus voltage across terminals (not shown) for a CES element according to an embodiment. Based, at least in part, on a voltage applied to terminals of the CES element (e.g., in a write operation), the CES element may be placed in a conductive state or an insulative state. For example application of a voltage $V_{set}$ and current density $J_{set}$ may place the CES element in a conductive memory state and application of a voltage $V_{reset}$ and a current density $J_{reset}$ may place the CES element in an insulative memory state. Following placement of the CES element in an insulative state or conductive state, the particular state of the CES element may be detected by application of a voltage $V_{read}$ (e.g., in a read operation) and detection of a current or current density at terminals of the CeRAM device.

According to an embodiment, the CES device of FIG. 1A may include any TMO, such as, for example, perovskites, Mott insulators, charge exchange insulators, and Anderson disorder insulators. In particular implementations, a CES device may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES device may be prepared without electroforming. Other implementations may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from claimed subject matter.

In one aspect, the CES device of FIG. 1A may comprise materials that are TMO metal oxide variable resistance materials, though it should be understood that these are exemplary only, and are not intended to limit claimed subject matter. Particular implementations may employ other variable resistance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences. In another particular example, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned Mott condition is met (injected electron holes=the electrons in a switching region), the CES element may rapidly switch from a conductive state to an insulator state via the Mott transition. This may occur at point 108 of the plot in FIG. 1A. At this point, electrons are no longer screened and become localized. This correlation may result in a strong electron-electron interaction potential which splits the bands to form an insulator. While the CES element is still in the insulative state, current may generated by transportation of electron holes. If enough bias is applied across terminals of the CES element, electrons may be injected into a metal-insulator-metal (MIM) diode over the potential barrier of the MIM device. If enough electrons have been injected and enough potential is applied across terminals to place the CES element in a particular low impedance or conductive state, an increase in electrons may screen electrons and remove a localization of electrons, which may collapse the band-splitting potential forming a metal.

According to an embodiment, current in a CES element may be controlled by an externally applied "compliance" condition determined based, at least in part, on an external current limited during a write operation to place the CES element in a conductive or low impedance state. This externally applied compliance current may also set a condition of a current density for a subsequent reset operation to place the CES element in a high impedance or insulative state. As shown in the particular implementation of FIG. 1A, a current density $J_{comp}$ applied during a write operation at point 116 to place the CES element in a conductive or low impedance state may determine a compliance condition for placing the CES device in a high impedance or insulative state in a subsequent write operation. As shown, the CES device may be subsequently placed in an insulative or high impedance state by application of a current density $J_{reset} \geq J_{comp}$ at a voltage $V_{reset}$ at point 108, where $J_{comp}$ is externally applied.

The compliance therefore may set a number of electrons in a CES element which are to be "captured" by holes for the Mott transition. In other words, a current applied in a write operation to place a CES element in a conductive memory state may determine a number of holes to be injected to the CES element for subsequently transitioning the CES element to an insulative memory state.

As pointed out above, a reset condition may occur in response to a Mott transition at point 108. As pointed out above, such a Mott transition may occur at condition in a CES element in which a concentration of electrons n equals a concentration of electron holes p. This condition may be modeled according to expression (1) as follows:

$$\lambda_{TF} n^{\frac{1}{3}} = C \sim 0.26 \tag{1}$$

$$n = \left(\frac{C}{\lambda_{TF}}\right)^3$$

where:
$\lambda_{TF}$ is a Thomas Fermi screening length; and
C is a constant.

According to an embodiment, a current or current density in a region 104 of the plot shown in FIG. 1A may exist in response to injection of holes from a voltage signal applied across terminals of a CES element. Here, injection of holes may meet a Mott transition criterion for the conductive state to insulative state transition at current $I_{MI}$ as a critical voltage $V_{MI}$ is applied across terminals of CES element. This may be modeled according to expression (2) as follows:

$$I_{MI}(V_{MI}) = \frac{dQ(V_{MI})}{dt} \approx \frac{Q(V_{MI})}{t} \tag{2}$$

$$Q(V_{MI}) = qn(V_{MI})$$

Where $Q(V_{MI})$ is the charged injected (hole or electron) and is a function of an applied voltage.

Injection of electron holes to enable a Mott transition may occur between bands and in response to critical voltage $V_{MI}$, and critical current $I_{MI}$. By equating electron concentration n with a charge concentration to bring about a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \tag{3}$$

$$J_{reset}(V_{MI}) = J_{MI}(V_{MI}) = \frac{I_{MI}(V_{MI})}{A_{CeRam}} = \frac{q}{A_{CeRam}t}\left(\frac{C}{\lambda_{TF}(V_{MI})}\right)^3$$

Where:
$A_{CeRam}$ is a cross-sectional area of a CES element; and
$J_{reset}(V_{MI})$ is a current density through the CES element to be applied to the CES element at a critical voltage $V_{MI}$ to place the CES element in an insulative state.

According to an embodiment, a CES element may be placed in a conductive memory state (e.g., by transitioning from an insulative memory state) by injection of a sufficient number of electrons to satisfy a Mott transition criteria.

In transitioning a CES to a conductive memory state, as enough electrons have been injected and the potential across terminal of the CES device overcomes a critical switching potential (e.g., $V_{set}$), injected electrons begin to screen and unlocalize double-occupied electrons to reverse a disproportion reaction and close the bandgap. A current density $J_{set}(V_{MI})$ for transitioning the CES to the conductive memory state at a critical voltage $V_{MI}$ enabling transition to the conductive memory state may be expressed according to expression (4) as follows:

$$I_{MI}(V_{MI}) = \frac{dQ(V_{MI})}{dt} \approx \frac{Q(V_{MI})}{t} \tag{4}$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{set}(V_{MI}) =$$

$$J_{injection}(V_{MI}) = J_{MI}(V_{MI}) = \frac{I_{MI}(V_{MI})}{A_{CeRam}} = \frac{q}{A_{CeRam}t}\left(\frac{C}{a_B}\right)^3 \text{ where:}$$

$a_B$ is a Bohr radius.

According to an embodiment, a "read window" 102 for detecting an impedance state of a CES element in a read operation may be set out as a difference between a portion 106 the plot of FIG. 1A while the CES element is in an insulative state and a portion 104 of the plot FIG. 1A while the CES element is in a conductive state at a read voltage $V_{read}$. In a particular implementation, read window 102 may be used to determine a Thomas Fermi screening length $A_{TF}$ of material making up the CES element. For example, at a voltage $V_{reset}$, current densities $J_{reset}$ and $J_{set}$ may be related to according to expression (5) as follows:

$$\lambda_{TF}(@V_{reset}) = a_B\left(\frac{J_{reset}}{J_{off}}\right)^{\frac{1}{3}} \tag{5}$$

In another embodiment, a "write window" 110 for placing a CES element in an insulative or conductive memory state in a write operation may be set out as a difference between $V_{reset}$ (at $J_{reset}$) and $V_{set}$ (at $J_{set}$). Establishing $|V_{set}| > |V_{reset}|$, enables a switch between conductive and insulative state. $V_{reset}$ may be approximately at a band splitting potential arising from correlation and $V_{set}$ may be approximately twice the band splitting potential. In particular implementations, a size of write window 110 may be determined based, at least in part, by materials and doping of the CES element.

Figure 1B:
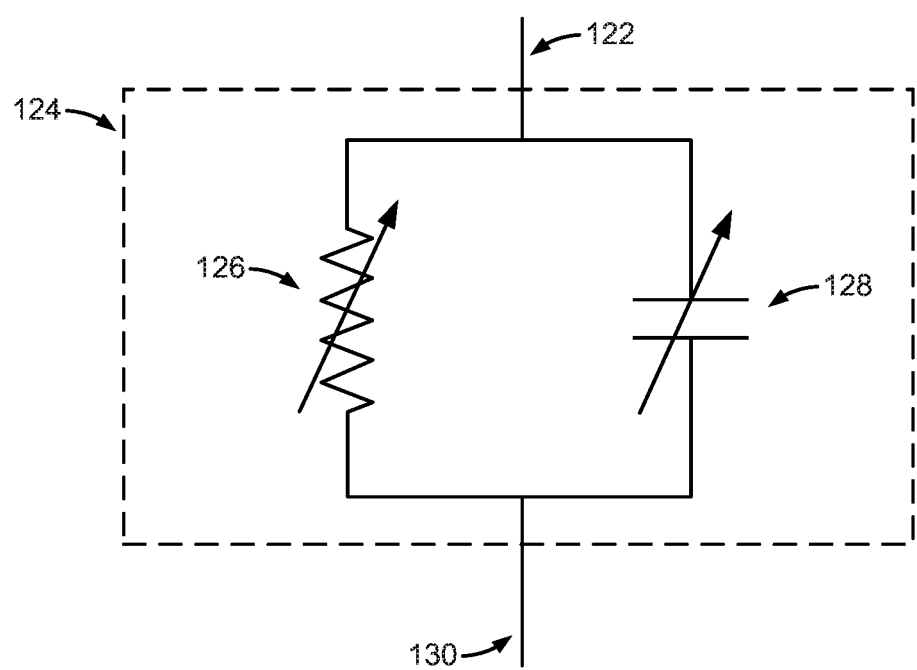
FIG. 1B is a schematic diagram of an equivalent circuit to a CES device according to an embodiment.

The transition from high resistance/capacitance to low resistance/capacitance in a CES element may be represented by a singular impedance of the CES element. FIG. 1B depicts a schematic diagram of an equivalent circuit of an example variable impeder device (such as a CES element), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Of course, although a variable resistor 126 and variable capacitor 128 are depicted in FIG. 1B as comprising discrete components, a variable impeder device, such as variable impeder device 124, may comprise a substantially homogenous CEM element, wherein the CEM element comprises characteristics of variable capacitance and variable resistance. Table 1 below depicts an example truth table for an example variable impeder device, such as variable impeder device 100.

TABLE 1

| Resistance | Capacitance | Impedance |
|---|---|---|
| $R_{high}$ ($V_{applied}$) | $C_{high}$ ($V_{applied}$) | $Z_{high}$ ($V_{applied}$) |
| $R_{low}$ ($V_{applied}$) | $C_{low}$ ($V_{applied}$)~0 | $Z_{low}$ ($V_{applied}$) |

In the particular implementation of a CES element of FIG. 1A, the CES element may be placed in either of two different impedance states: a low impedance or conductive state responsive to a set operation and a high impedance or insulative state responsive to a reset operation.

Write operations to place a CES element in a particular impedance state, using either a SET or RESET operation, typically entails application of a programming signal to terminals of the CES element imparting a voltage and a current. Thus in an attempt to write values to a portion of a CeRAM memory array, each CES element to represent a bit value in the portion of the CeRAM memory array may consume an incremental amount of energy. In certain implementations such as in a small computing device powered by a battery (e.g., an Internet of Things (IoT) device), this incremental amount of energy may deplete energy stored in the battery.

According to an embodiment, to express a value in a portion of a memory array (e.g., a byte, word or other portion of a memory array having contiguous bits), SET and RESET operations may be performed to place particular bits in a particular value state (e.g., so that individual bits express a logical or numerical value of "0" or "1"). For example, a SET operation may be applied to some particular bits in a memory array to impart a value state of "1" and a RESET operation may be applied to other particular bits in a memory array to impart a value state of "0." In one particular implementation, operations to express a value in a portion of a memory array (e.g., with some bits having values of "0" while other bits having values of "1") may include a first phase to apply operations to place selected bits in a first value state (e.g., applying SET operations to the selected bits to express a value state of "1") followed by a second phase to apply operations to place other, unselected bits in a second value state (e.g., applying RESET operations to the unselected bits to express a value of "0"). For example, bits selected for placement in the first value state in the first phase may be masked in the second phase to place remaining bits in the second value state.

According to an embodiment, a small battery-powered computing device may include devices capable of capturing renewable energy for recharging a battery under certain conditions. For example, a small battery-powered computing device may include one or more solar cells, small wind generators, etc., to supply electrical energy for recharging the battery during "energy rich" conditions (e.g., presence of wind and sunlight) to be used/discharged to perform operations during "energy lean" or "energy scarce" conditions (e.g., absence of wind and sunlight available for powering a device or recharging a battery).

Particular embodiments are directed to, among other things, reducing energy consumption at computing devices during energy lean or energy scarce conditions. In one particular implementation, bit positions of a portion of a memory array of a computing device may be placed in a first value state during an energy rich condition (e.g., presence of renewable energy for consumption or for recharging a battery). To represent a particular value in the portion of the memory during a subsequent energy lean condition, selected ones of the bit positions in the portion of the memory may be changed from the first value state to a second value state while maintaining remaining unselected ones of the bit positions in the first value state. Here, to represent the particular value in the portion of the memory array, no programming signal need be applied to unselected ones of the bit positions as they are to remain in the first value state. This may reduce energy depleted to represent the particular value in the portion of the memory array during the energy lean condition.

Furthermore, particular embodiments described may also significantly reduce time to represent a particular value in a portion of a memory array by reducing an operation to represent the particular value to a single phase following determination of the particular value. Here, by placing bit positions of a portion of a memory array in a first value state prior to determination of a particular value to be represented in the portion of the memory array (e.g., by performing a SET operations on the bit positions place in a "1" value state), only a single phase may be needed following determination of the particular value to place selected bit positions in a second value state (e.g., by performing RESET operations on selected bit positions in a "0" value state).

Figure 2:
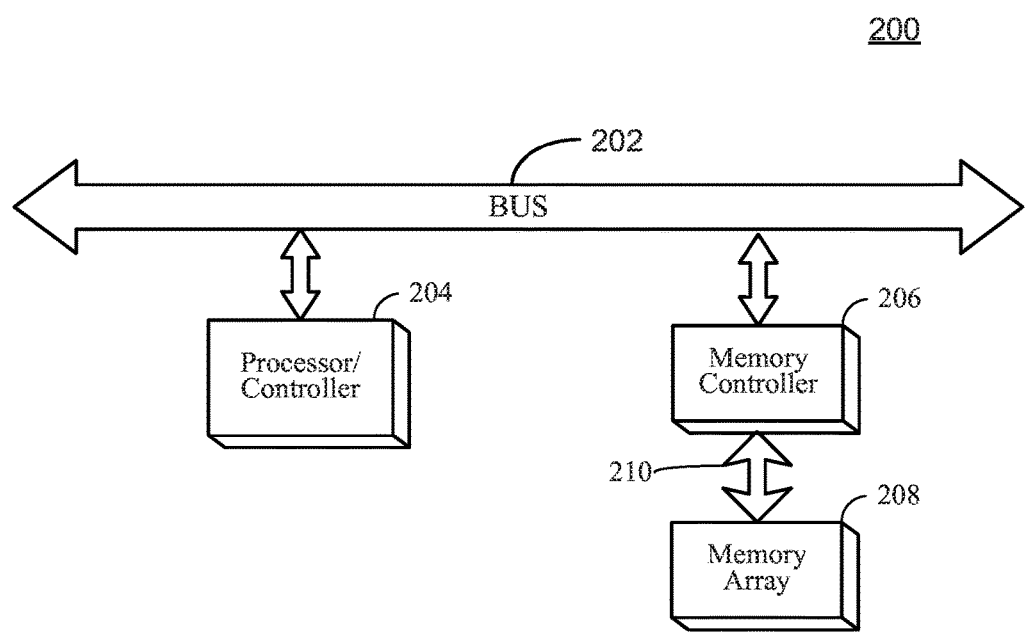
FIG. 2 is a schematic diagram of a computing device according to an embodiment.

FIG. 2 is a schematic diagram of a computing device 200 according to an embodiment. A processor/controller 204 may execute processes or procedures (e.g., under control of computer-readable instructions) to perform various tasks including, for example, storing values in or reading values from addressable portions of memory array 208. In a particular implementation, processor/controller 204 may communicate with a memory controller 206 through bus 202 according to a predefined interface. Processor/controller 204 may provide commands (e.g., specifying a physical memory address) to memory controller 206 to write values to or read values from an addressable portion of memory array 208.

Memory array 208 may comprise one or more volatile or non-volatile memory devices including, for example, a memory array comprising CES elements as described above. Processor/controller 204, memory controller 206 and memory array 208 may be formed as separate components or integrated together in a system-on-a-chip (SoC) along with other components not shown (e.g., sensors, user interface, I/O devices or renewable energy collection devices). Furthermore, processor/controller 204, memory controller 206 and memory array 208 may be formed from any one of several different process technologies including, for example, CEM processes discussed above and complementary metal oxide semiconductor (CMOS) processes.

Figure 3:
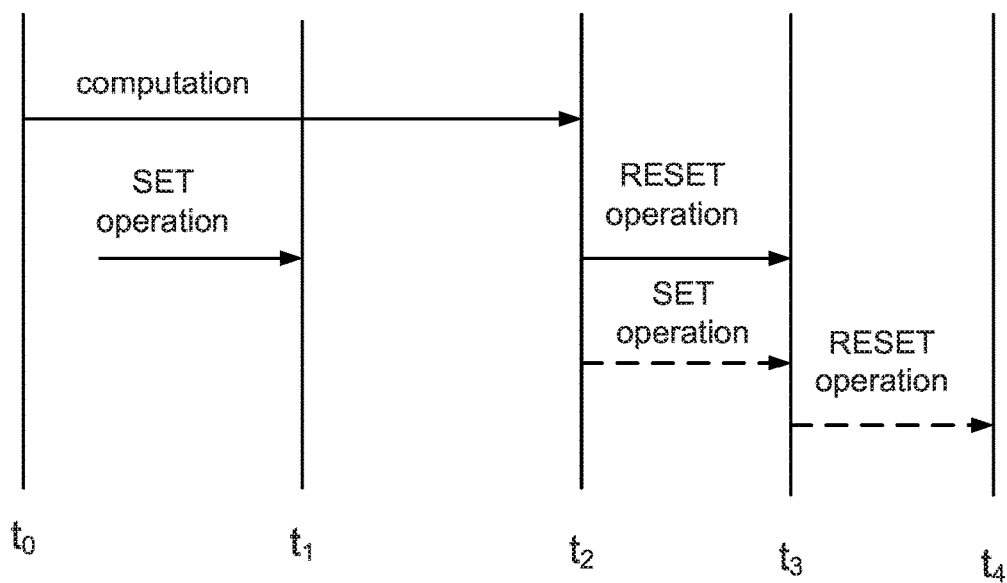
FIG. 3 is a diagram illustrating operations of a computing platform according to an embodiment.

FIG. 3 is a diagram illustrating operations of a computing device such as computing device 200 described above. In an example implementation, operations as depicted in FIG. 3 may be performed by a computing device operating during an energy lean condition or an energy rich condition as discussed above. In the presently illustrated embodiment, a computation may be executed (e.g., by processor/controller 204) to determine one or more values to be stored or represented in a portion of a memory array (e.g., in one or more bytes, words or blocks in memory array 208). Such a computation may comprise, for example, a computation performed to process and record sensor measurements or a computation performed in response to a input received at a user interface, just to provide a couple of examples. As shown, this computation may complete at time $t_2$. Prior to completion of computation at time $t_2$, operations may be performed on bit positions of a portion of a memory array to place the bit positions in a particular value state at time $t_1$ prior to completion of an operation at time $t_2$.

Table 2 below illustrates value states of bit positions in a portion of a memory array according to an example embodiment of FIG. 3. For simplicity of illustration, the particular portion of the memory array comprises an 8-bit byte. It should be understood, however, that in other embodiments the particular portion may comprise a word (e.g., 16-bit to 64-bit word) or block, or any other portion of a memory array that is addressable for operations. As shown, at time $t_1$, bit positions are placed uniformly in a value state of "1." As shown in FIG. 3, this may be performed by executing SET operations on the bit positions. In other embodiments, bit positions in the portion of the memory array may be placed uniformly in a value state of "0" at time $t_1$ using a RESET operation without deviating from claimed subject matter. A computation completing at time $t_2$ may determine a value to be represented as "11010111" in the portion of the memory array. Here, value states at bit positions of the portion of the memory array at time $t_1$ (representing "11111111") may be changed to represent value states of the computed value by merely changing value states of bit positions 2 and 4 from "1" to "0," while value states of other remaining bit positions at "1."

TABLE 2

| bit position | value state at time $t_1$ | value state at time $t_3$ |
|---|---|---|
| 0 | 1 | 1 |
| 1 | 1 | 1 |
| 2 | 1 | 0 |
| 3 | 1 | 1 |
| 4 | 1 | 0 |
| 5 | 1 | 1 |
| 6 | 1 | 1 |
| 7 | 1 | 1 |

In particular scenarios, operations to uniformly place bit positions of a portion of a memory array in a particular first value state at $t_1$ may be executed during an energy rich condition while operations to place selected bit positions at second value state completing at time $t_3$ may be executed during an energy lean condition. Here, in the particular example illustrated in Table 2, only changing value states of bit positions 2 and 4 from "1" to "0" at time $t_3$ may enable a reduction in battery depletion during an energy lean condition to store a value from computation completing at time $t_2$.

As discussed above, particular embodiments may represent a desired value in a portion of a memory in two phases of operation on bit positions in the portion: a first phase to place selected bit positions in a first value state (e.g., SET operations on the selected bit positions) followed by a second phase to place unselected bits in a second value state (e.g., RESET operations on the unselected bit positions). Uniformly placing bit positions of a portion of a memory array in a particular first value state at $t_1$ (and prior to completion of computation at time $t_2$) may enable placement of bit positions of the portion of the memory array in value states to represent the desired value following a single phase at completion of computations at time $t_2$. Without uniformly placing bit positions in a particular value state prior to completion of computation at time $t_2$ and commencing a two phase operation at completion of computation at time $t_2$, the portion of the memory array does not represent the desired value until a until RESET operation completes at time $t_4$.

Figure 4:
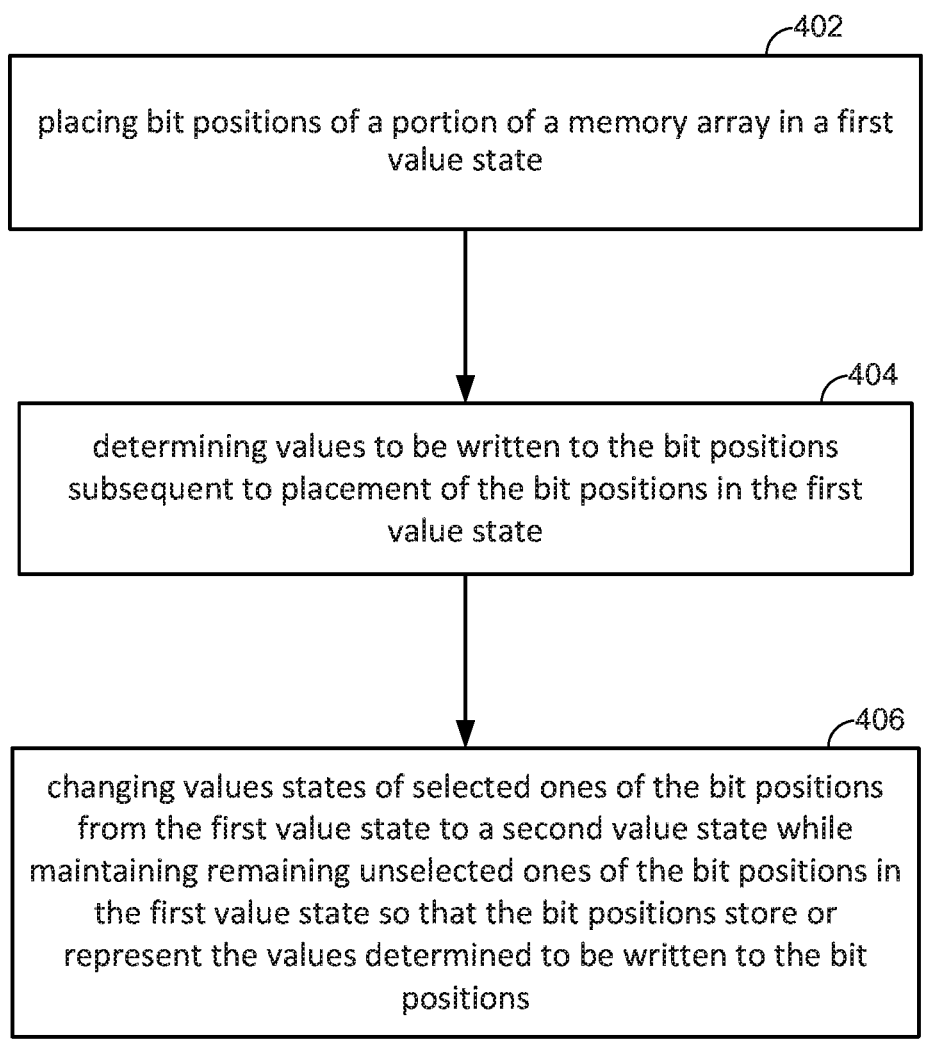
FIG. 4 is a flow diagram of a process affecting value states of a portion of a memory array according to an embodiment.

FIG. 4 is a flow diagram of a process affecting value states of a portion of a memory array according to an embodiment. In a particular implementation, the process of FIG. 4 may be performed by memory controller 206 in combination with memory array 208. Block 402 may comprise placing bit positions of a portion of a memory array in a first value state. As illustrated in the particular example of FIG. 3 and Table 2, block 402 may comprise performing SET operations on bit positions to uniformly place the bit positions in a value state of "1." Alternative implementations, as discussed above, may comprise block 402 performing RESET operations on bit positions to uniformly place the bit positions in a value state of "0."

Block 404 may comprise determining values to be written to (or to be represented by) the bit positions of the memory array subsequent to placement of the bit position in the first value state in block 402. Block 404 may comprise, for example, receipt at memory controller 206 of a command from processor/controller 204 to store one or more values in a particular addressable portion of memory array 208. Block 404 may occur, for example, following completion of a computation at processor/controller 204.

Block 406 may comprise changing values states of particular selected bit positions in a portion of a memory array while maintaining remaining unselected ones of the bit positions in the first value state. In the particular example of Table 2, block 406 may comprise changing value states of bit positions 2 and 4 from "1" to "0," while value states of other remaining bit positions at "1." In one particular implementation, block 406 may comprise performing a write operation on bit positions in the portion of the memory array while masking unselected bit positions (e.g., bit positions 0, 1, 3, 5, 6 and 7 of the particular example of Table 2) so that value states of the masked unselected bit positions are unchanged.

In a particular implementation, portions of a memory array may be associated with metadata indicating a status of the portion as representing a value of interest or having bit positions uniformly placed in a particular value state (e.g., having uniform value states of "1" or uniform value states of "0"). A portion of a memory array having bit positions uniformly placed in a single particular value state may be identified as being "fallow." For example, the portion of the memory array may be placed in a fallow state by applying a SET operation or a RESET operation to all bit positions in the portion of the memory array during an energy rich condition as described above. FIGS. 5A through 5B illustrate portions of a memory array comprising words (e.g., 16-bit to 64-bit word portions) associated with a word status as a "1" to indicate an associated memory portion is in a fallow state and a "0" to indicate that an associated memory portion represents an intended value previously stored in the associated memory portion (e.g., as a consequence of actions performed at block 406). FIG. 5A shows the status of seven addressable words in a memory array in a fallow status. FIG. 5A may represent the status of words in an initialized state as formed in fabrication. FIG. 5B shows that five portions of the memory array have been changed to represent values as word values $w_0$ through $w_4$ (e.g., following a change of selected ones of bit positions from a first value state to a second value state initiated by a command while maintaining unselected bit positions in the first value state as described with reference to block 406). A word value $w_2$ represented by a particular portion of a memory array may no longer be desired or necessary and, consequently, it may be desirable to store a different word value it its place in the future. Here, word value $w_2$ may be identified as being "dirty." According to an embodiment, a subsequent operation may be applied the memory array portion storing word value $w_4$ to return the memory array portion to a fallow state (e.g., placing bit positions of the memory array portion in a first value state as described with reference to block 402) to provide portions of the memory array as shown in FIG. 5C. According to an embodiment, such an operation to return the memory array portion to a fallow state may be performed under an energy rich condition so as to reduce battery depletion.

Figure 6:
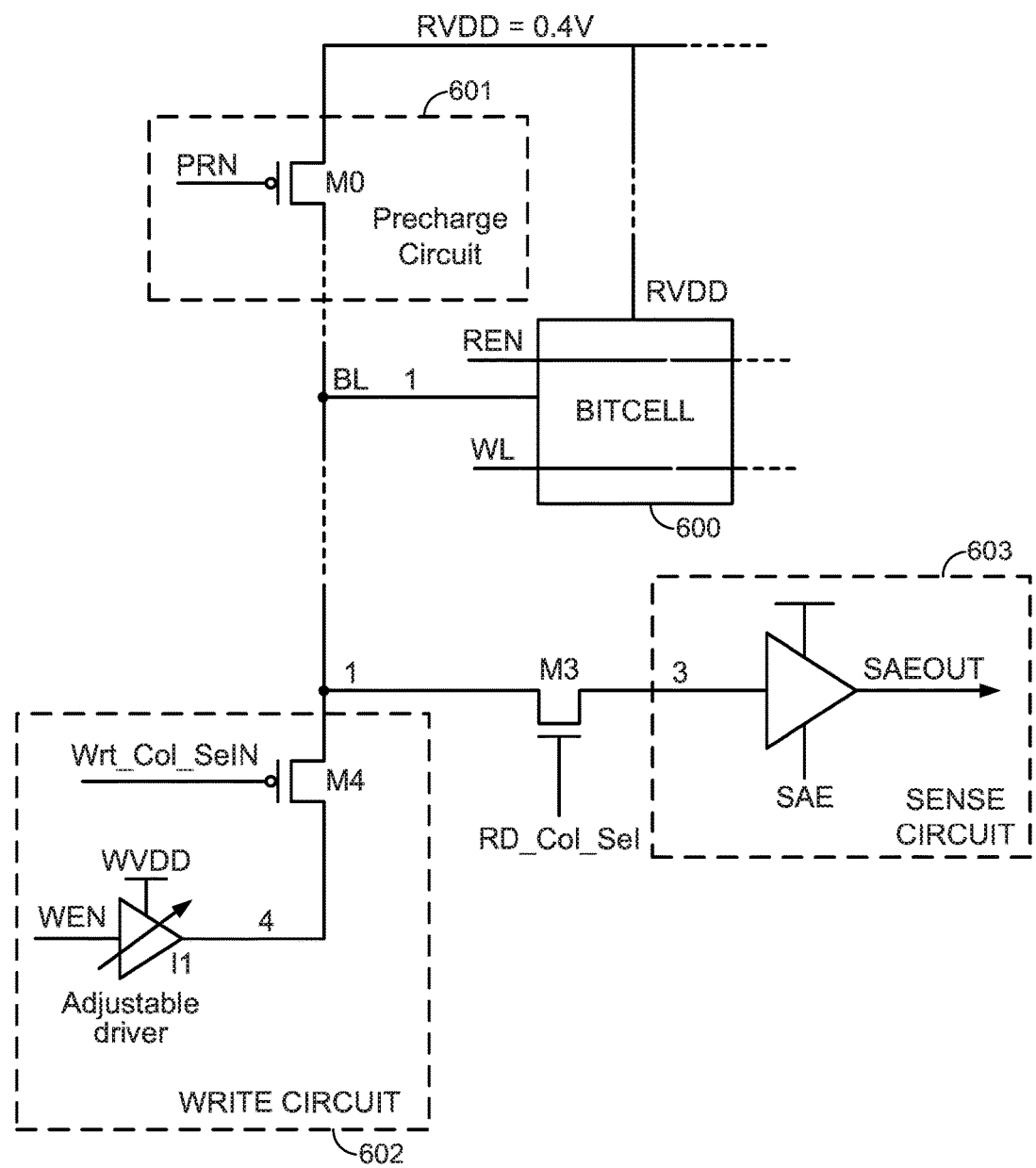
FIG. 6 is a schematic diagram of a memory circuit according to an embodiment.

FIG. 6 is a schematic diagram of a memory circuit according to an embodiment. A bitcell circuit 600 may comprise one or more memory elements (e.g., non-volatile memory elements) comprising a CES element. In this context, a "bitcell" or "bitcell circuit" as referred to herein comprises a circuit or portion of a circuit capable of representing a value, symbol or parameter as a state. For example, a bitcell may comprise one or more memory devices that are capable of representing a value, symbol or parameter as a memory state of the memory device. In particular implementations, a bitcell may represent a value, symbol or parameter as a single bit or multiple bits. In a particular implementation, memory array 208 may be formed from multiple bitcell circuits 600 as described herein.

According to an embodiment, bitcell circuit 600 may comprise memory elements having a behavior similar to that of the CES device discussed above in connection with FIG. 1A. For example, a memory element in bitcell 600 may be placed in a particular memory state (e.g., conductive or low impedance memory state, or insulative or high impedance memory state) by independently controlling voltage and current applied across terminals of the memory element in a "write operation." As discussed below in particular implementations, such a write operation may be executed by application of a signal which is controlled to provide a critical current and voltage across terminals of the memory device to place the memory device in a particular memory state. In another aspect, a memory state of a memory element in bitcell 600 may be detected or sensed in a "read operation" by precharging a bitline BL by closing transistor M0 in response to a drop in voltage of signal PRN to connect bitline BL with voltage RVDD=0.4V. Transistor M0 may subsequently open in response to an increase in voltage of signal PRN, followed by a closing of transistor M3 in response to an increase in voltage of signal RD_Col_Sel to connect bitline BL to sense circuit 603. In this context, a "bitline" comprises a conductor that is connectable to at least one terminal of a memory element during a write operation to transmit a signal altering a memory state of the memory element, or during a read operation to transmit a signal indicative of a current memory state of the memory element. Sense circuit 603 may detect a memory state of the memory element in bitcell 600 based on a magnitude of current or voltage from bitline BL through transistor M3 in a read operation. An output signal may have a voltage that is indicative of a current memory state of bitcell 600 (e.g., as a "1," "0" or other symbol). In one aspect of a read operation, to detect a current memory state of a memory element, a voltage of a signal applied across terminals of the memory element in bitcell 600 may be controlled so as to not detectably alter the current memory state of the memory element.

Figure 7A:
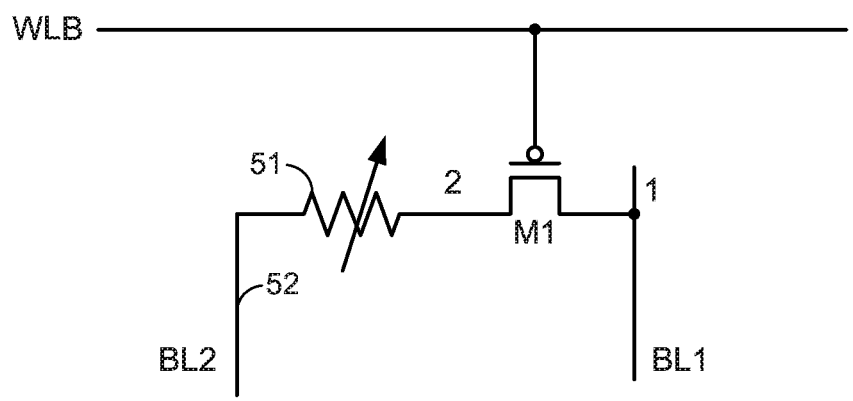
FIGS. 7A and 7B are schematic diagrams of alternative architectures for a bitcell according to particular embodiments.
Figure 7B:
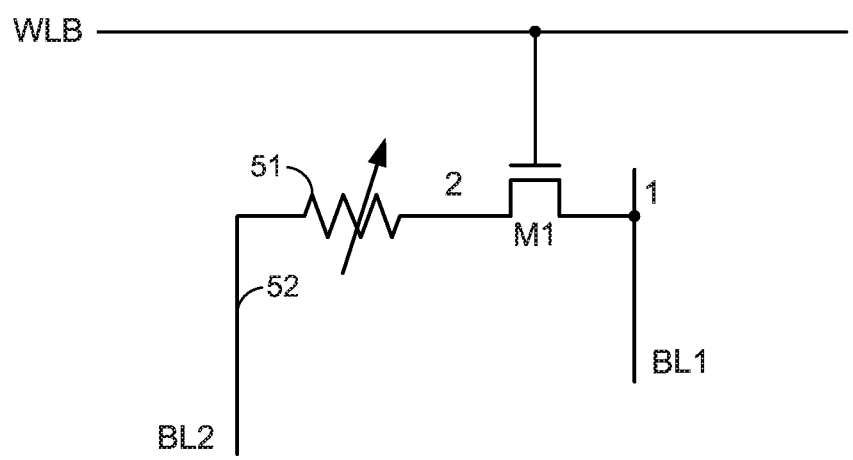

FIGS. 7A and 7B are directed to specific implementations of a bitcell circuit that include CES devices or elements to store a particular memory state as an impedance state. In particular implementations, memory array 208 may be formed from multiple bitcell circuits as illustrate in FIGS. 7A and 7B. While the description below provides CeRAM devices or non-volatile memory elements as specific examples of devices in a bitcell capable of maintaining a memory state, it should be understood that these are merely example implementations. For example, it should be recognized a CES adapted for purposes other than a non-volatile memory device or CeRAM device may be used for storing a particular memory state (e.g., two or more conductive or low impedance memory states, or an insulative or high impedance memory state) in a write operation which is detectable in a subsequent read operation, and that claimed subject matter is not limited to either implementation of a CeRAM or non-volatile memory devices. Thus, bitcell implementations of a CES shown in FIGS. 7A and 7B should be viewed as merely example implementations of a CES, and that aspects of the present disclosure may be applied differently without deviating from claimed subject matter.

As pointed out above in FIG. 1A, a memory state of a CES device in bitcell 700 may be changed or determined based on a particular voltage and current applied to bitline BL. For example, providing a signal to bitline BL having a voltage $V_{reset}$ and a sufficient current $I_{reset}$ may place a CES device of bitcell 700 in an insulative or high impedance memory state. Likewise, providing a signal to bitline BL having a voltage $V_{set}$ and a sufficient current $I_{set}$ may place a CES device of bitcell 700 in a conductive or low impedance memory state. As may be observed from FIG. 1A, while a magnitude of voltage $V_{set}$ is greater than a magnitude of voltage $V_{reset}$, a magnitude of current $I_{set}$ is lower than a magnitude of current $I_{reset}$.

A write operation performed in connection with write circuit 702 is described herein as a particular process of placing a memory device such as a CES element in a particular memory state of a plurality of predetermined memory states by applying a "programming signal" to terminals of the memory device. Particular ones of the predetermined memory states may correspond to particular voltage levels to be applied to the memory device (e.g., $V_{set}$ and $V_{reset}$). Similarly, particular ones of the predetermined memory states may correspond to particular current levels to be applied to the memory device (e.g., $I_{set}$ and $I_{reset}$). Accordingly, in a particular embodiment, a programming signal to place a CES device in a particular memory state in a write operation may be controlled to have a particular voltage level and current level corresponding to the particular memory state.

As described in a particular implementation below, a voltage signal having a voltage level for a programming signal to place a memory device in a predetermined memory state may be selected at a signal selection circuit based, at least in part, on a data signal. Conducting elements connected to the signal selection circuit may selectively connect the voltage signal to or disconnect the voltage signal from the memory device at a current level corresponding to the predetermined memory state based, at least in part, on the data signal. In this context, a "conducting element" comprises a circuit element capable of permitting current to pass between two nodes. In a particular implementation, a conducting element may vary a current permitted to pass between nodes based, at least in part, on a particular condition. The particular implementations described below employ FETs as conducting elements to permit current to pass between source and drain terminals based, at least in part, on a voltage applied to a gate terminal. It should be understood, however, that other types of devices such as a bipolar transistor, diode, variable resistor, etc. may be used as a conducting element, and that claimed subject matter is not limited in this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

The particular example implementations of FIGS. 7A and 7B in combination with the example implementation of FIG. 6 may be capable of providing a read voltage signal to terminals of a non-volatile memory element or CES during read operations. Here, signal Wrt_Col_SelN may be lowered during read operations to close FET M4 and connect the read voltage signal to bitline BL (in addition to being lowered during write operations to connect a programming signal to bitline BL). In alternative implementations (as described below), a read voltage may be generated locally at bitcell 600 to be provided to terminals of a memory element during read operations. In which case, signal Wrt_Col_SelN may be raised during read operations to open FET M4 signal and disconnect write circuit from bitline BL.

FIGS. 7A and 7B are schematic diagrams of alternative architectures for a bitcell according to particular embodiments. In a particular implementation of a read operation, a bitline may be connected to a terminal of a non-volatile memory (NVM) element through a first conducting element in response to a voltage signal on a wordline. As pointed out above, a "non-volatile memory" comprises an integrated circuit device in which a memory cell or element maintains its memory state (e.g., a conductive or low impedance memory state, or an insulative or high impedance memory state) after power supplied to the device is removed. In this context, a "wordline" comprises a conductor for transmitting a signal to select a particular bitcell or group of bitcells to be accessed in a read operation or a write operation. In a particular example implementation, a voltage of a signal on a wordline may be raised or lowered to select or deselect a particular bitcell or group of bitcells to be connected to a corresponding bitline or group of bitlines during a read or write operation. It should be understood, however, that this is merely an example of a wordline and that claimed subject matter is not limited in this respect. Also, in this context, a "reference node" comprises a node in a circuit that is maintained at a particular voltage level or at a particular voltage difference from another node in the circuit. In one example, a reference node may comprise or be connected to a ground node. In other particular implementations, a reference node may be maintained at a particular voltage relative to that of a ground node.

According to an embodiment, in a first write operation to place an NVM element in a first memory state, a bitline may be connected to a first terminal to the NVM element through a conducting element in response to a voltage signal on a wordline. In the first write operation, a programming signal having a first write voltage and a first write current may be applied across terminals of the NVM element to place the NVM element in a first memory state (e.g., an insulative or high impedance memory state). In a second write operation to place the NVM element in a second memory state, the bitline may be connected again to the first terminal of the NVM element through the first conducting element in response to the voltage signal on the wordline. The second write operation may apply a programming signal having a second write voltage and a second write current between terminals of the NVM element to place the NVM element in a second memory state (e.g., a particular conductive or low impedance memory state from among multiple distinguishable low impedance or conductive states). In a particular implementation, the NVM element may comprise a CES element or CeRAM element having one or more properties discussed above with reference to FIG. 1A in that $|V_{reset}|<|V_{set}|$ while $|I_{reset}|>|I_{set}|$. Accordingly, in the particular examples illustrated in FIGS. 7A and 7B, a magnitude of the first write voltage may be greater than a magnitude of the second write voltage, and a magnitude of the first write current may be less than a magnitude of the second write current. Following placement of the NVM element in the second memory state, a third voltage (e.g., $V_{read}$) may be applied across the terminals of the NVM element in a read operation to detect a current memory state of the NVM element. While the third voltage is being applied during the read operation, a current between the first and terminals may be limited to less than a magnitude of the first current (e.g., $|I_{read}|<|I_{reset}|$) to maintain the second memory state of the NVM element (e.g., conductive or low impedance memory state).

In one aspect, NVM element 52 comprises a CES element connected to a FET M1 at a first terminal and a bitline BL2 at a second terminal. In response to a wordline voltage WLB applied to a gate terminal of FET M1, M1 may connect the first terminal of NVM element 52 to bitline BL1 during read or write operations. In one particular implementation, bitline BL2 may be connected to a reference node such as a ground node (not shown). In other implementations, bitlines BL1 and BL2 may comprise complementary bitlines to apply an appropriate voltage (e.g., $V_{set}$ or $V_{reset}$) and current (e.g., $I_{set}$ or $I_{reset}$) across first and second terminals of NVM 52 in a write operation to place NVM 52 in a desired memory state, or to apply an appropriate voltage (e.g., $V_{read}$) in a read operation. In this particular example implementation, BL2 may be connected to a write circuit through an additional conducting element (not shown) in response to a wordline signal voltage.

As pointed out above, a write circuit may independently control a voltage and a current of a signal applied to NVM element 52 in a write operation based, at least in part, on whether the write operation is to place NVM element 52 in a conductive or low impedance memory state, or an insulative or high impedance memory state. For example, for a write operation to place NVM element 52 in a conductive or low impedance memory state, a signal having a voltage $V_{set}$ and a current $I_{set}$ may be applied. Likewise, for a write operation to place NVM element 52 in an insulative or high impedance memory state, a signal having a voltage $V_{reset}$ and a current $I_{reset}$ may be applied. As illustrated in FIG. 1A, voltage $V_{set}$ may have a greater magnitude than voltage $V_{reset}$ while current $I_{set}$ may have a smaller magnitude than current $I_{reset}$. As discussed above in a particular implementation, write circuit 602 may independently control voltage and current to provide a signal to a bitline to place a non-volatile memory device in a conductive or low impedance memory state, or an insulative or high impedance state.

To detect a current memory state of NVM element 52, M1 may connect bitline BL1 to node 2 to apply a read voltage $V_{read}$ across first and second terminals of NVM 52 in a read operation. While read voltage $V_{read}$ is applied, a current flowing through bitline BL1 may then be sensed (e.g., at sense circuit 603) to detect a current state of NVM element 52. According to an embodiment, a magnitude of a current flowing through terminals of NVM element 52 during a read operation may be limited to less than the magnitude of $I_{reset}$. This may prevent an unintended transition of a current state of NVM element 52 in a conductive or low impedance memory state to an insulative or high impedance memory state during a read operation. Current flowing through terminals of NVM element 52 during a read operation may be controlled, for example, by controlling a voltage applied to a gate of FET M1 during read operations. In the particular implementation of FIG. 7B, FET M1 is configured as an NFET. Here, a boosted wordline voltage signal WL may be applied during a write operation to permit sufficient current flowing through NVM element 52 to place NVM element 52 in a particular memory state. A voltage of wordline voltage signal WL may then be lowered during read operations to limit current flowing through NVM element 52. Alternatively, a voltage source applying a read voltage to bitline BL1 and/or BL2 (e.g., write circuit 602) may limit a current flowing to bitline BL1 and/or BL2 during a read operation.

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A method comprising:
   placing bit positions of a portion of a memory array in a first value state responsive, at least in part, to a presence of at least one renewable energy source to power a device;
   determining values to be written to the bit positions subsequent to placement of the bit positions in the first value state;
   changing value states of selected ones of the bit positions from the first value state to a second value state while maintaining remaining unselected ones of the bit positions in the first value state so that the bit positions store or represent the values determined to be written to the bit positions, wherein the value state of the selected ones of the bit positions are changed from the first value state to the second value state during an absence of the at least one renewable energy source to power the device; and
   placing the bit positions of the portion of the memory array in the first value state responsive, at least in part, to a subsequent presence of the at least one renewable energy source to power the device following the absence of the at least one renewable energy resource to power the device.

2. The method of claim 1, wherein the memory array comprises correlated electron memory elements.

3. The method of claim 2, and wherein placing the bit positions in the first value state comprises placing correlated electron memory elements corresponding to the bit positions in a high impedance or insulative state, and wherein changing value states of selected ones of the bit positions from the first value state to a second value state comprises placing correlated electron memory elements corresponding to the selected ones of the bit positions in a low impedance or conductive state.

4. The method of claim 2, and wherein placing the bit positions in the first value state comprises placing correlated electron memory elements corresponding to the bit positions in a low impedance or conductive state, and wherein changing value states of the selected ones of the bit positions from the first value state to a second value state comprises placing correlated electron memory elements corresponding to the selected ones of the bit positions in a high impedance or insulative state.

5. The method of claim 1, wherein changing value states of the selected ones of the bit positions further comprises:
   masking the unselected ones of the bit positions; and
   applying a write operation to the selected ones of the bit positions.

6. The method of claim 1, wherein changing value states of the selected ones of the bit positions occurs responsive, at least in part, to a command to write a particular value, parameter or symbol to the portion of the memory array.

7. The method of claim 1, wherein placing bit positions of the portion of the memory array in the first value state comprises applying a SET operation to the bit positions, and wherein changing the values states of the selected ones of the bit positions from the first value state to the second value state comprises applying a RESET operation to the selected ones of the bit positions.

8. The method of claim 1, wherein placing bit positions of the portion of the memory array in the first value state comprises applying a RESET operation to the bit positions, and wherein changing the values states of the selected ones of the bit positions from the first value state to the second value state comprises applying a SET operation to the selected ones of the bit positions.

9. A device comprising:
   a memory array; and
   a memory controller to initiate operations to at least write value states to addressable portions of the memory array to:
   place bit positions of a portion of the memory array in a first value state responsive, at least in part, to a presence of at least one renewable energy source to power the device;
   determine values to be written to the bit positions subsequent to placement of the bit positions in the first value state;
   change value states of selected ones of the bit positions from the first value state to a second value state while maintaining remaining unselected ones of the bit positions in the first value state so that the bit positions store or represent the values determined to be written to the bit positions, wherein the value state of the selected ones of the bit positions are to be changed from the first value state to the second value state during an absence of the at least one renewable energy source to power the device; and place the bit positions of the portion of the memory array in the first value state responsive, at least in part, to a subsequent presence of the at least one renewable energy source to power the device following the absence of the at least one renewable energy resource to power the device.

10. The device of claim 9, wherein the memory controller is further to determine the values to be written to the bit positions based, at least in part, on one or more signals received from a processor connected through a bus connected to the memory controller.

11. The device of claim 9, wherein the memory array comprises correlated electron memory elements.

12. The device of claim 9, wherein:

the first value state comprises a high impedance or insulative state; and the second value state comprises a low impedance or conductive state.

13. The device of claim 9, wherein:

the first value state comprises a low impedance or conductive state; and the second value state comprises a high impedance or insulative state.

14. The device of claim 9, wherein the memory controller is further to:

mask unselected ones of the bit positions; and apply a write operation to the selected ones of the bit positions to thereby change the value states of the selected ones of the bit positions from the first value state to the second value state while maintaining remaining unselected ones of the bit positions in the first value state.

15. The device of claim 9, wherein the memory controller is further to change the value states of the selected ones of the bit positions in response to a command to write a particular value, parameter or symbol to the portion of the memory array.

16. The device of claim 9, wherein the memory controller is further to:

apply a SET operation to the bit positions to place bit positions of the portion of the memory array in the first value state;

apply a RESET operation to the selected ones of the bit positions to change the values states of the selected ones of the bit positions from the first value state to the second value state.

17. The device of claim 9, wherein the memory controller is further to:

apply a RESET operation to the bit positions to place bit positions of the portion of the memory array in the first value state;

apply a SET operation to the selected ones of the bit positions to change the values states of the selected ones of the bit positions from the first value state to the second value state.

18. The device of claim 9, and further comprising:

a battery; and one or more energy collection devices capable of capturing renewable energy from the at least one renewable energy source to recharge the battery.

* * * * *